United States Patent
Lee et al.

(10) Patent No.: US 7,626,380 B2
(45) Date of Patent: Dec. 1, 2009

(54) SENSOR MODULE FOR DETECTING RELATIVE DISPLACEMENT AND METHOD OF DETECTING MOVING DIRECTION USING THE SAME

(75) Inventors: Dong-Rak Lee, Busan (KR); Jae-Woo Park, Gyeongsangnam-do (KR); Bong-Geun Cho, Busan (KR); Hyoung-Jun Moon, Busan (KR)

(73) Assignee: S & T Daewoo Co., Ltd., Busan (KR)

( * ) Notice: Subject to any disclaimer, the term of this patent is extended or adjusted under 35 U.S.C. 154(b) by 194 days.

(21) Appl. No.: 11/780,835

(22) Filed: Jul. 20, 2007

(65) Prior Publication Data
US 2008/0265876 A1    Oct. 30, 2008

(30) Foreign Application Priority Data
Apr. 26, 2007    (KR)    ..................... 10-2007-0040775

(51) Int. Cl.
*G01R 33/09*    (2006.01)
*H01L 43/02*    (2006.01)

(52) U.S. Cl. .................................. 324/207.21; 324/252
(58) Field of Classification Search ............ 324/207.21, 324/252
See application file for complete search history.

(56) References Cited

U.S. PATENT DOCUMENTS 6,246,234 B1 *    6/2001    Yokotani et al. ........ 324/207.21

* cited by examiner

*Primary Examiner*—Reena Aurora
(74) *Attorney, Agent, or Firm*—Duane Morris, LLP

(57) ABSTRACT

The present invention relates to a sensor module for detecting a relative displacement of an object having a groove pattern with alternately formed projection and depression, which comprises a magnet for generating a magnetic field; a giant magneto resistance (GMR) sensor installed between the magnet and the object to detect a variation in the magnetic field and output an electric signal; a signal processing part for processing the output signal from the GMR sensor to output a square wave; and a housing for supporting the magnet, the GMR sensor and the signal processing part, and a method of detecting a moving direction using the same.

9 Claims, 6 Drawing Sheets

SENSOR MODULE FOR DETECTING RELATIVE DISPLACEMENT AND METHOD OF DETECTING MOVING DIRECTION USING THE SAME

This application claims the benefit of Korean Patent Application No. 2007-40775, filed on Apr. 26, 2007, in Korea, which is hereby incorporated by reference for all purposes as if fully set forth herein.

BACKGROUND OF THE INVENTION

1. Field of the Invention

The present invention relates to a sensor module for detecting a relative displacement of an object and more particularly, to a sensor module for detecting a relative displacement of a cylindrical actuator in a non-contact manner using a Giant Magneto Resistance (GMR) sensor.

2. Discussion of the Related Art

Generally, a cylindrical actuator which is operated by hydraulic or pneumatic pressure is widely used in a vehicle or an industrial equipment and the cylindrical actuator includes a cylinder, a piston valve which reciprocates inside the cylinder and a piston rod connected to the piston valve to transmit a driving force, etc.

In addition, in a case of controlling precisely an operation of an actuator or in a case that automatization of the actuator is requested, the operation of an actuator is controlled by detecting a displacement of the piston valve or a piston using a sensor and feed-backing the detection result.

For example, a damper, which constructs a cylindrical actuator used in a vehicle, is installed between a vehicle body and a wheel of the vehicle to serve to absorb vibration or impact from the road surface, and an electronically controlled damper installed in a luxury car detects a relative position of an axle and a vehicle body through a sensor and controls actively its damping force or tensile force.

Therefore, a sensor which is detectable of a state of an actuator should be used in order to feedback-control the operation of the electronically controlled damper or other cylindrical actuator. Various kinds of sensors are currently used and the sensors can be largely divided into a contact sensor and non-contact sensor.

However, because the contact sensor (for example, a potentiometer) detects a moving state of a piston rod or a piston valve in a state of contacting with the piston rod or the piston valve, there are problems that the sensor is frequently damaged due to a friction and has a relatively short product life.

In addition, there is an optical sensor as a typical non-contacting sensor and it has problems that it is weak in an impact and cannot be used when light is blocked by a foreign body.

SUMMARY OF THE INVENTION

Accordingly, the present invention is directed to a sensor module that substantially obviates one or more of problems due to limitations and disadvantages of the related art.

It is an object of the present invention to provide a sensor module which is capable of detecting a movement of an object more stably and in non-contact manner.

It is another object of the present invention to provide a sensor module which can be used regardless of a shape of an actuator and has superior durability.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a sensor module for detecting a relative displacement of an object having a groove pattern with alternately formed projection and depression, which comprises a magnet for generating a magnetic field; a giant magneto resistance (GMR) sensor installed between the magnet and the object to detect a variation in the magnetic field and output an electric signal; a signal processing part for processing the output signal from the GMR sensor to output a square wave; and a housing for supporting the magnet, the GMR sensor and the signal processing part.

The GMR sensor has a structure in which a serially connected pair of a first resistor device and a second resistor device and a serially connected pair of a third resistor device and a forth resistor device are parallelly connected, and the electric signal is all output voltage generated according to a variation in a magnetic field between a first node between the first resistor device and the second resistor device and a second node between the third resistor device and the forth resistor device.

The GMR sensor is provided with a first sub sensor and a second sub sensor for detecting a variation in a magnetic field and outputting an electric signal respectively, and a front end portion of the first sub sensor and a front end portion of the second sub sensor are spaced along a moving direction of the object and thus an output signal of the first sub sensor and an output signal of the second sub sensor are generated with a time difference when the object moves.

The signal processing part may comprise a signal amplifying part for amplifying the output signal of the GMR sensor; and a digital transformation part for transforming the signal amplified in the signal amplifying part to a square wave to send to an outside.

In addition, the housing is provided with an opening at an end thereof and the GMR sensor is mounted on an outside of a PCB substrate which closes the opening, and a protective cover may be provided at an outside of the GMR sensor.

In addition, the magnet may be a permanent magnet which is secured to an inside of the PCB substrate.

In addition, a second PCB substrate mounted with the signal processing part and attached circuits is installed inside the housing and the PCB substrate and the second PCB substrate are electrically connected through FPCB.

In another aspect, the present invention provides a method of detecting a moving direction of an object using a GMR sensor having a first sensor and a second sensor which are installed to be spaced to each other along a moving direction of the object having a groove pattern with alternately formed projection and depression and output an electrical signal corresponding to a variation in a magnetic field respectively, comprising a step of determining a moving direction of the object by recognizing an output sequence of a first electrical signal generated in the first sensor and a second electrical signal generated in the second sensor when the object moves with respect to the first and the second sensors.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiment of the present invention, which is illustrated in the accompanying drawings.

Figure 1A:
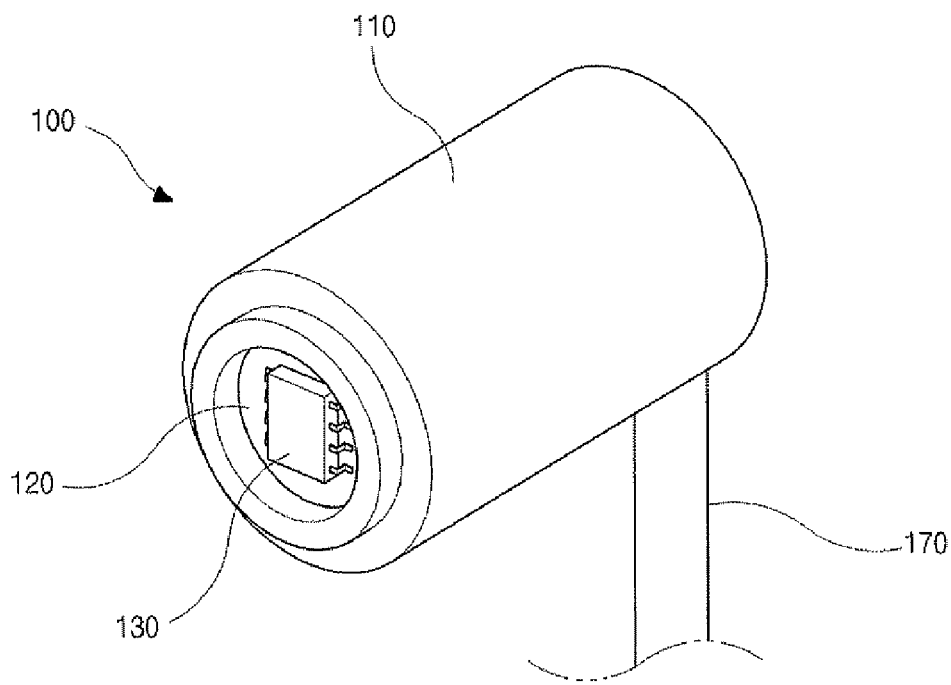
FIG. 1a and FIG. 1b are a perspective view and a partially broken perspective view illustrating a sensor module according to an embodiment of the present invention, respectively.
Figure 1B:
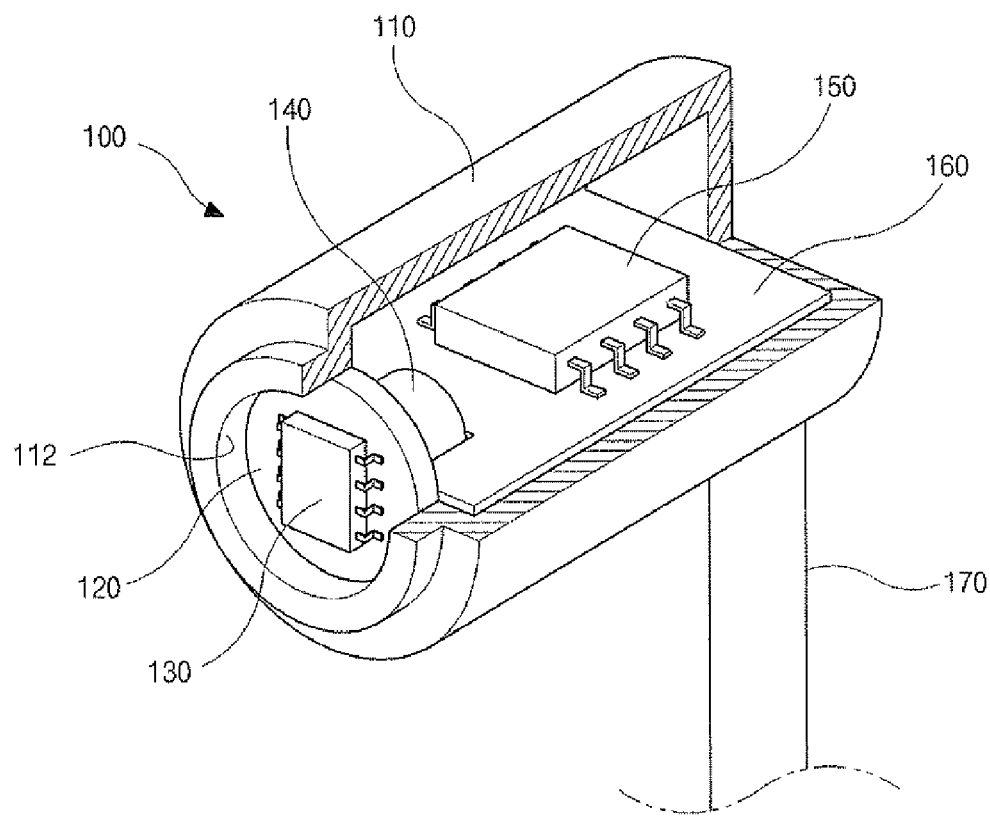

A sensor module 100 according to an embodiment of the present invention, as shown in FIG. 1a and FIG. 1b which are a perspective view and a partially broken perspective view respectively, includes a housing 110 provided with a hollow part therein and formed with an opening 112 at an end thereof, a first PCB 120 which closes the opening 112 in the housing 110, a GMR sensor 130 coupled to an outside of the first PCB 120 and a permanent magnet 140 coupled to an inside of the first PCB 120.

In addition, a signal processing part 150 for processing an output signal from the GMR sensor 130 is installed in the housing and the signal processing part 150 and other attached circuits are mounted on a second PCB 160.

A power/signal line 170 is lead out of the housing 110 and the power/signal line 170 includes a power supply line for supplying power which is necessary to operate the GMR sensor 130 and the signal processing part 150 and a signal transmission line for transmitting an output signal from the signal processing part 150 to outside.

An external shape of the housing 110 may be varied as an installation place and thus not limited to the cylindrical shape as shown.

The GMR sensor 130 has a property that a resistance value of a built-in resistor device varies according to an intensity of a circumferential magnetic field and thus an output voltage varies according to a variation in the circumferential magnetic field even under the same input voltage.

Accordingly, such the GMR sensor has been used in a field related to recording and reproducing of a Hard Disk Drive (HDD) because the intensity of the magnetic field can be measured by using the output voltage of the GMR sensor 130.

The embodiment of the present invention suggests the sensor module 100 for detecting a relative displacement of a cylindrical actuator in non-contact manner using such the GMR sensor 130.

The GMR sensor 130 is exposed out of the housing 110 through the opening 112 of the housing 110 in the state of being mounted on the first PCB, however a protective cover (not shown) may be further provided at an outside of the GMR sensor 130 to protect the GMR sensor 130 from contaminants.

The second PCB 160 mounted with the signal processing part 150 for processing the output signal from the GMR sensor 130 should be electrically connected with the first PCB 120 on which the GMR sensor 130 is mounted. For this end, the first PCB 120 and the second PCB 160 can be connected using FPCB and the like. Of course, other electrical connection means may be used.

Figure 2:
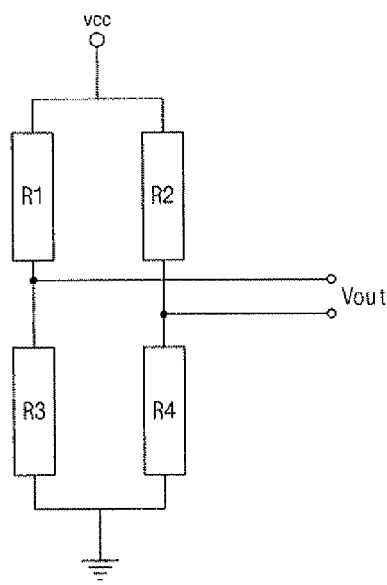
FIG. 2 is a conceptual view of a GMR sensor.

The GMR sensor 130 may be fabricated in a variety of shapes and one example thereof is shown in a block diagram of FIG. 2. In other words, four resistor devices R1, R2, R3 and R4 are connected in the form of Wheatstone bridge to construct the GMR sensor 130 and, at this time, the resistor devices R1, R2, R3 and R4 are thin metal films which are vapor-deposited on a substrate and at least one of the resistor devices R1, R2, R3 and R4 has a property that its resistance value varies according to an intensity of peripheral magnetic field.

Therefore, if the magnetic field varies at the circumference of the GMR sensor, a resistant balance of the Wheatstone bridge is broken and a predetermined output voltage Vout is generated in the GMR sensor 130.

Figure 3:
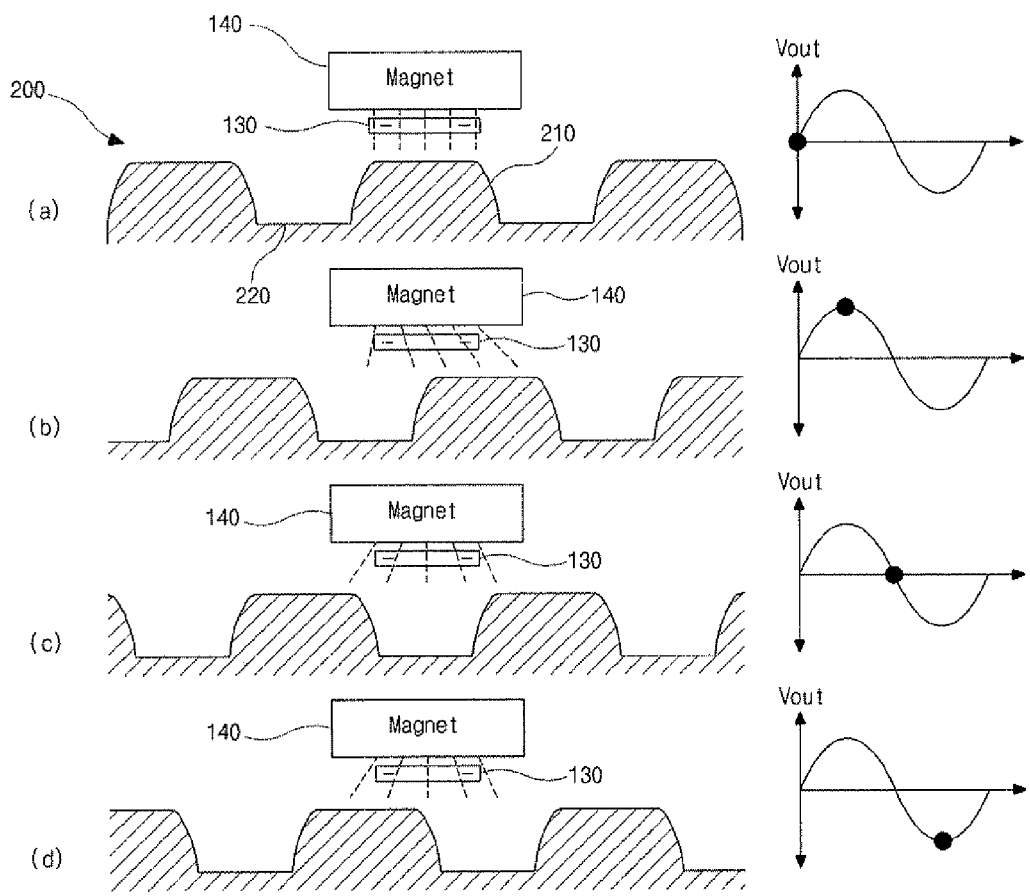
FIG. 3 is a view sequentially illustrating a principle in which the GMR sensor detects a movement of an object.

FIG. 3 is a view illustrating variation in the output voltage Vout of the GMR sensor 130 with a movement of an object.

If a metal object 200 is moved in the state that the permanent magnet 140 is installed to be adjacent to the metal object 200 having the groove pattern, a distance between the permanent magnet 140 and the metal object 200 is varied periodically because of a projection 210 and a depression 220 of the groove pattern, whereby a pattern of the magnetic field between the permanent magnet 140 and the metal object 200 is periodically varied.

Therefore, if the GMR sensor is installed between the permanent magnet 140 and the metal object 200, a resistance value of the resistor device which is built in the GMR sensor 130 is changed due to the variation in the magnetic field and thus the output voltage Vout is periodically changed.

Firstly, assume that in the case that the GMR sensor 130 has the resistor devices R1, R2, R3 and R4 connected as shown in FIG. 2 and the GMR sensor 130 is placed at an upper portion of the projection 210 of the metal object 200 as shown in FIG. 3A, resistance values of the resistor devices R1, R2, R3 and R4 are balanced and thus the output voltage Vout is 0.

Subsequently, when the permanent magnet 140 is started to overlap with an upper portion of the depression 220 while the metal object 200 moves to the right side of the drawing as shown in FIG. 3b, the resistant balance of the GMR sensor 130 is broken due to the variation in the magnetic field and an output voltage Vout is started to be generated.

The output voltage Vout is gradually increased, and then decreased again as the GMR sensor 130 is much overlapped with the upper portion of the depression 220, and the Vout becomes zero as the resistant balance is made again when the permanent magnet is completely positioned on the upper portion of the depression 220 as shown in FIG. 3c.

When the metal object 200 moves continuously to the right side of the drawing and the permanent magnet 140 is started to overlap again, with the upper portion of the projection 210 as shown in FIG. 3d, the resistant balance of the GMR sensor 130 is broken again and the output voltage Vout is started to be generated and, in this case, the output voltage Vout has an opposite polarity to FIG. 3a.

Consequently, while the metal object 200 having the groove pattern of the projection 210 and the depression 220 moves with respect to the permanent magnet 140, the GMR sensor 130 generates continuously the output voltage Vout of a sine wave form.

Figure 4:
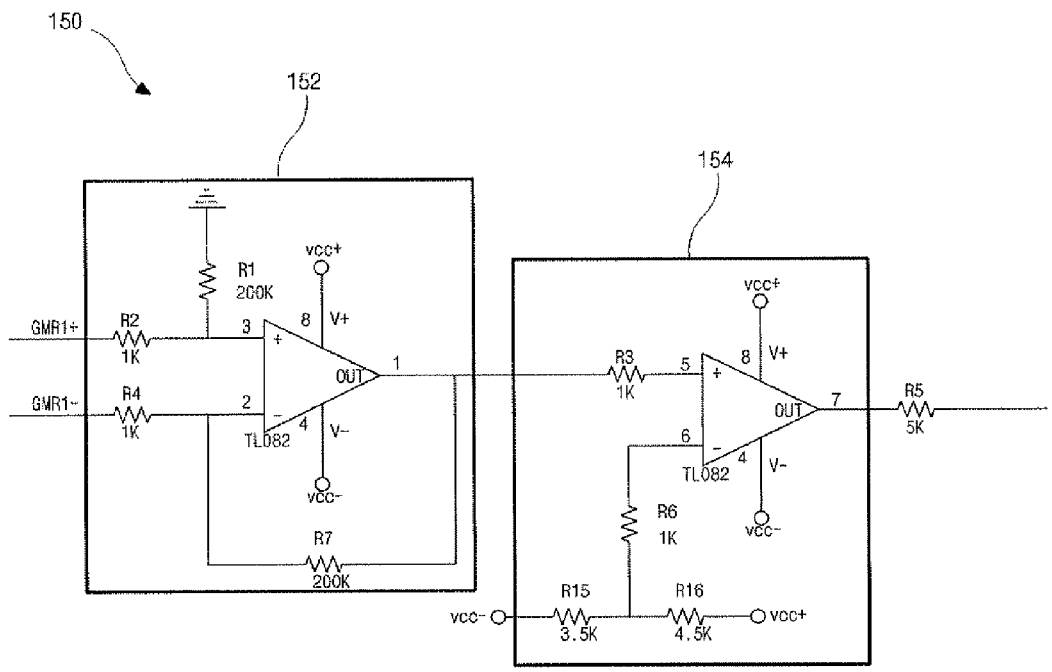
FIG. 4 is a circuit block diagram illustrating a signal processing part.

The signal processing part 150 includes a signal amplifying part 152 and a digital transformation part 154 as shown in a circuit block diagram of FIG. 4.

The signal amplifying part 152 serves to amplify the output voltage Vout of the GMR sensor 130 and, for example, the output voltage Vout which is amplified to R7/R4, i.e. 200 times can be obtained in the circuit of FIG. 4.

The digital transformation part 154 serves to transform the signal amplified in the signal amplifying part 152 to a square wave.

A frequency, a pulse width, offset data and the like output from the digital transformation part 154 is transmitted to a control module (not shown) for controlling an operation of the actuator, and the control module determines a moving speed or moving distance of the metal object 200 using such the data, sends a necessary control signal and thus feedback-controls the operation of the actuator.

Meanwhile, if using the GMR sensor 130 described above, there is a problem that it is possible to detect the movement of the object whereas it is impossible to determine a moving direction.

In other words, in the case that the output voltage Vout of the GMR sensor 130 goes from the maximum value as shown in FIG. 3b to zero, it is difficult to determine whether the GMR sensor 130 is placed at the position of FIG. 3a or at the position of FIG. 3c.

To solve this, an embodiment of the present invention, detects the moving direction of the object using the GMR sensor 130 having two sensors in one semiconductor chip. In other words, the GMR sensor 130 is comprised of a first sub sensor 130a and a second sub sensor, which has four resistor devices constructing the Wheatstone bridge, respectively, as shown in FIG. 5.

At this time, if the first and the second sub sensors 130a and 130b are not formed in the same position but formed so that a front end of the first sub sensor 130a and a front end of the second sub sensor 130b are spaced in a predetermined distance in a moving direction of the object, since points of time, at which the output voltages Vout are generated from the first sub sensor 130a and the second sub sensor 130b, become different, the moving direction of the object can be determined using this.

Figure 5:
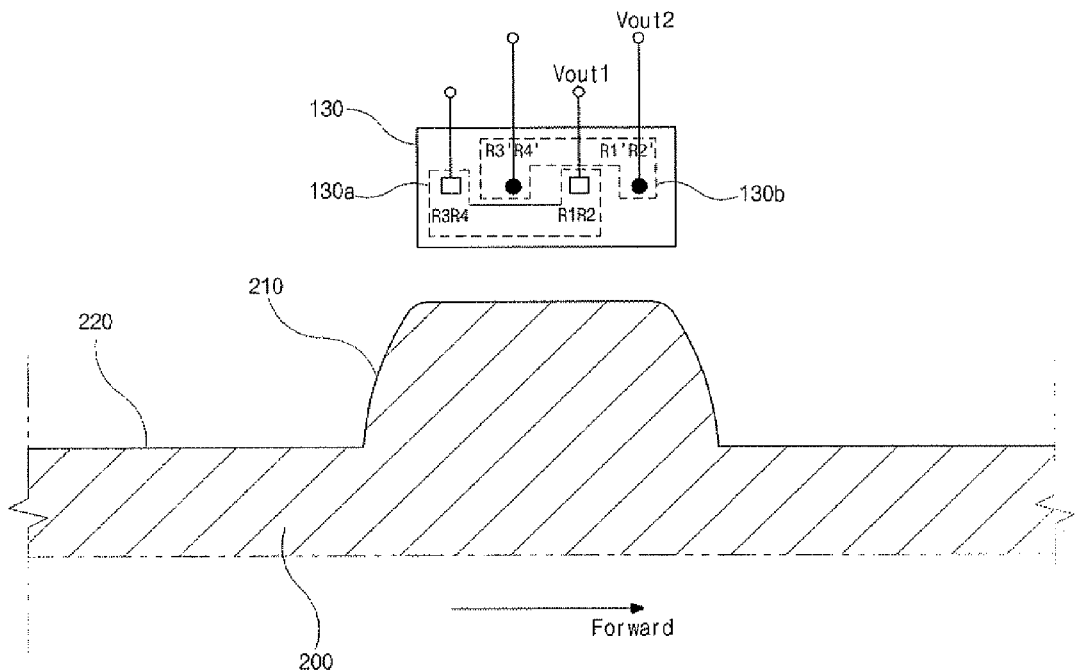
FIG. 5 is a view illustrating that a GMR sensor having two sub sensors detects an object.

In other words, if the metal object 200 moves to the right side of the drawing in FIG. 5, the first sub sensor 130a is located at the upper portion of the depression 220 prior to the second sub sensor 130b while the depression 220 approaches to a lower portion of the GMR sensor 130.

Therefore, the output voltage is firstly generated from the first sub sensor 130a due to the variation in the magnetic field and then the output voltage is generated from the second sub sensor 130b after predetermined time has elapsed.

Figure 6A:
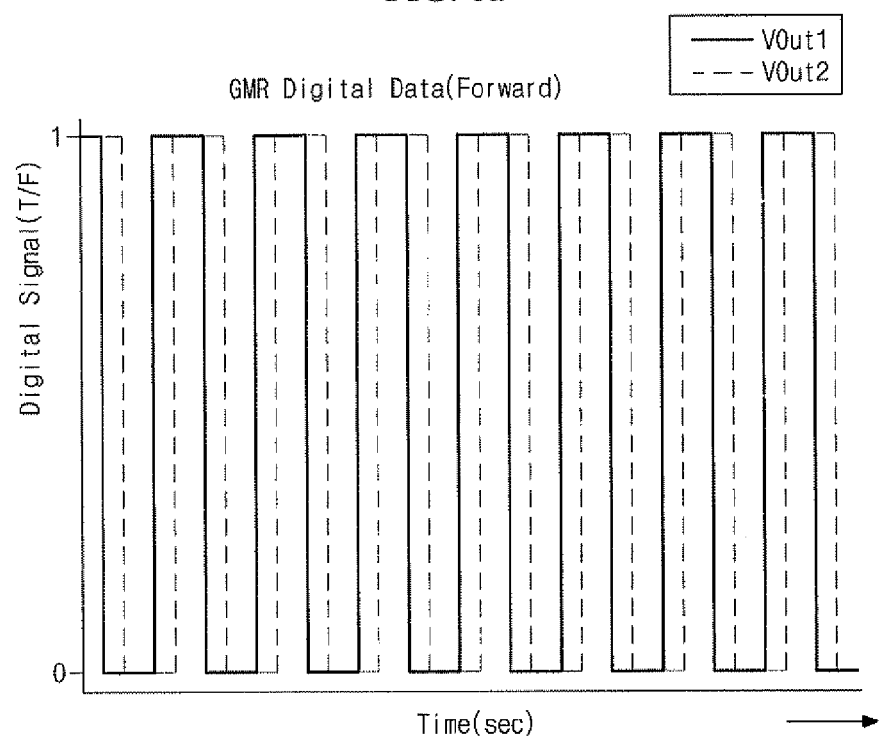
FIG. 6a and FIG. 6b are views illustrating that output signals from the two sub sensors have a time difference according to a moving direction of the object.

In this case, the output signal of the signal processing part 150 is expressed as shown in FIG. 6a and thus it would be appreciated that the output signal Vout1 of the first sub sensor 130a precedes in time the output signal Vout2 of the second sub sensor 130b.

If the metal object 200 moves to the left side of the drawing, the output voltage is firstly generated from the second sub sensor 130b and the output voltage is generated from the first sub sensor 130a after predetermined time has elapsed.

Figure 6B:
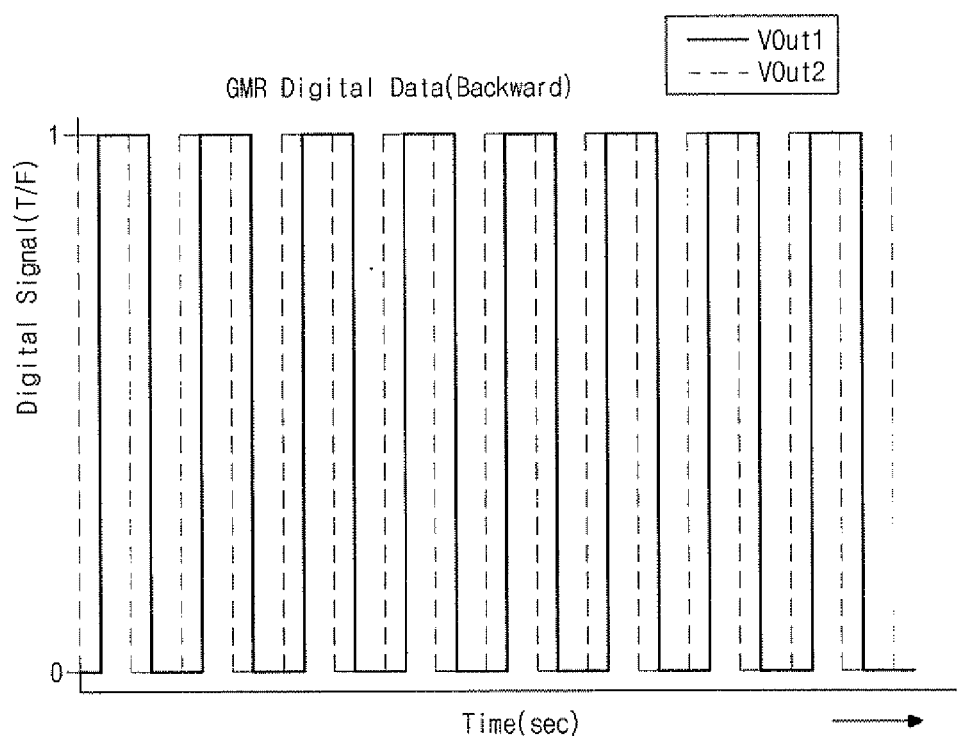

In this case, observing the output signals of the signal processing part 150, the output, signal Vout2 from the second sub sensor 130b precedes in time the output signal Vout1 from the first sub sensor 130a as shown in FIG. 6b.

Consequently, the moving direction of the metal object 200 can be determined by using a generation sequence of the output signal of the first sub sensor 130a and the output signal of the second sub sensor 130b.

Figure 7:
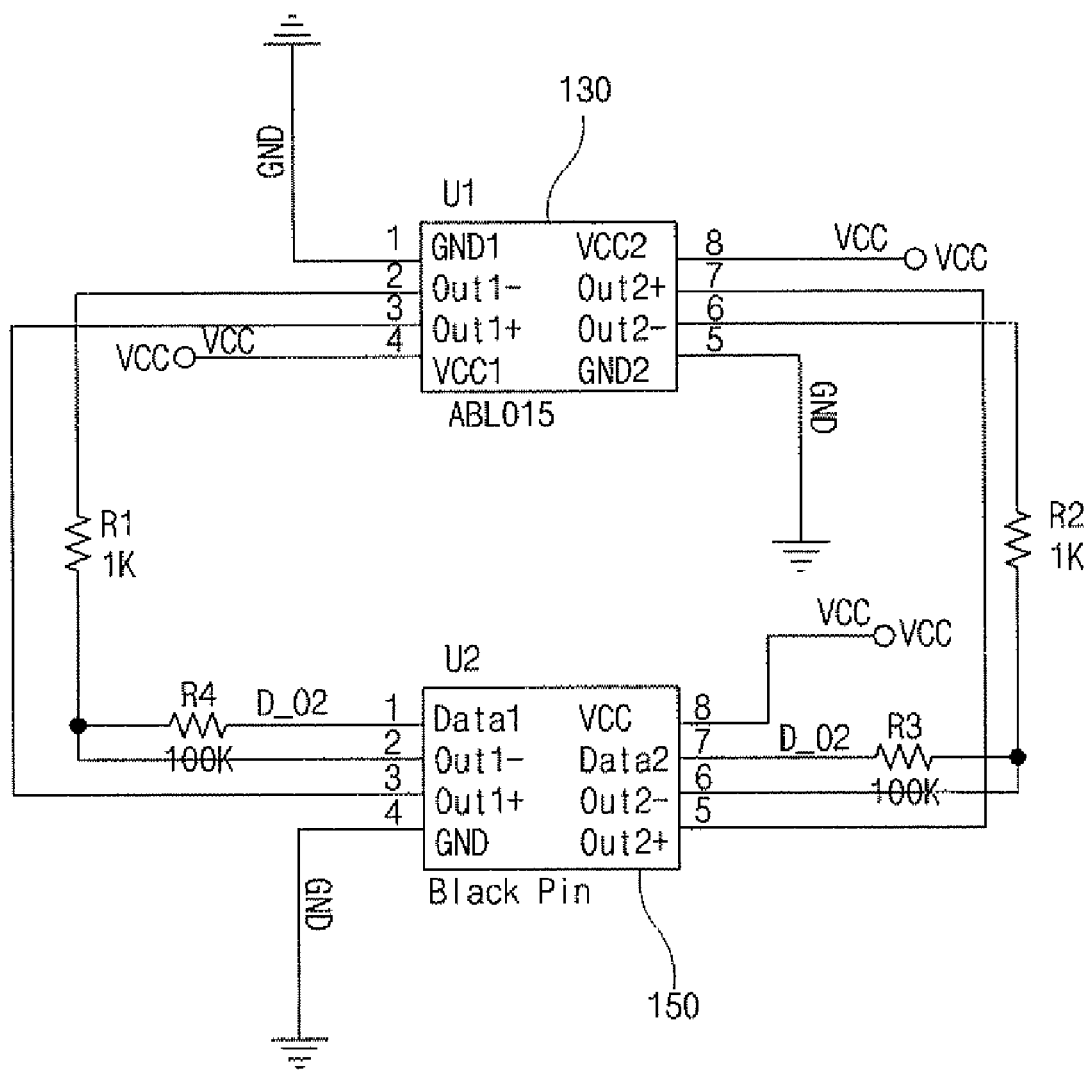
FIG. 7 is a circuit block diagram illustrating a connection between the GMR sensor having the two sub sensors and the signal processing part.

FIG. 7 is a circuit block diagram illustrating a connection between the GMR sensor 130 having the sub sensors and the signal processing part 150.

In the GMR sensor 130, each sub sensor is provided with an independent output terminal Vout1, Vout2. And the signal processing part 150 processes independently the signals from each of the output terminals Vout1 and Vout2 of the GMR sensor 130 and then outputs in square waves.

The sensor module described above can be used in a variety of usages. For example, it may be used to detect an operation state of a piston valve of a vehicle damper or used in a landing gear of a flight vehicle. In addition, it may be used to detect an operation of an actuator of an industrial equipment or a construction equipment such as an excavator, or used in a usage for detecting an operation of an actuator of an equipment for factory automation.

It will be described hereinafter a case that the sensor module 100 according to an embodiment of the present invention is installed in a vehicle damper 10.

Figure 8:
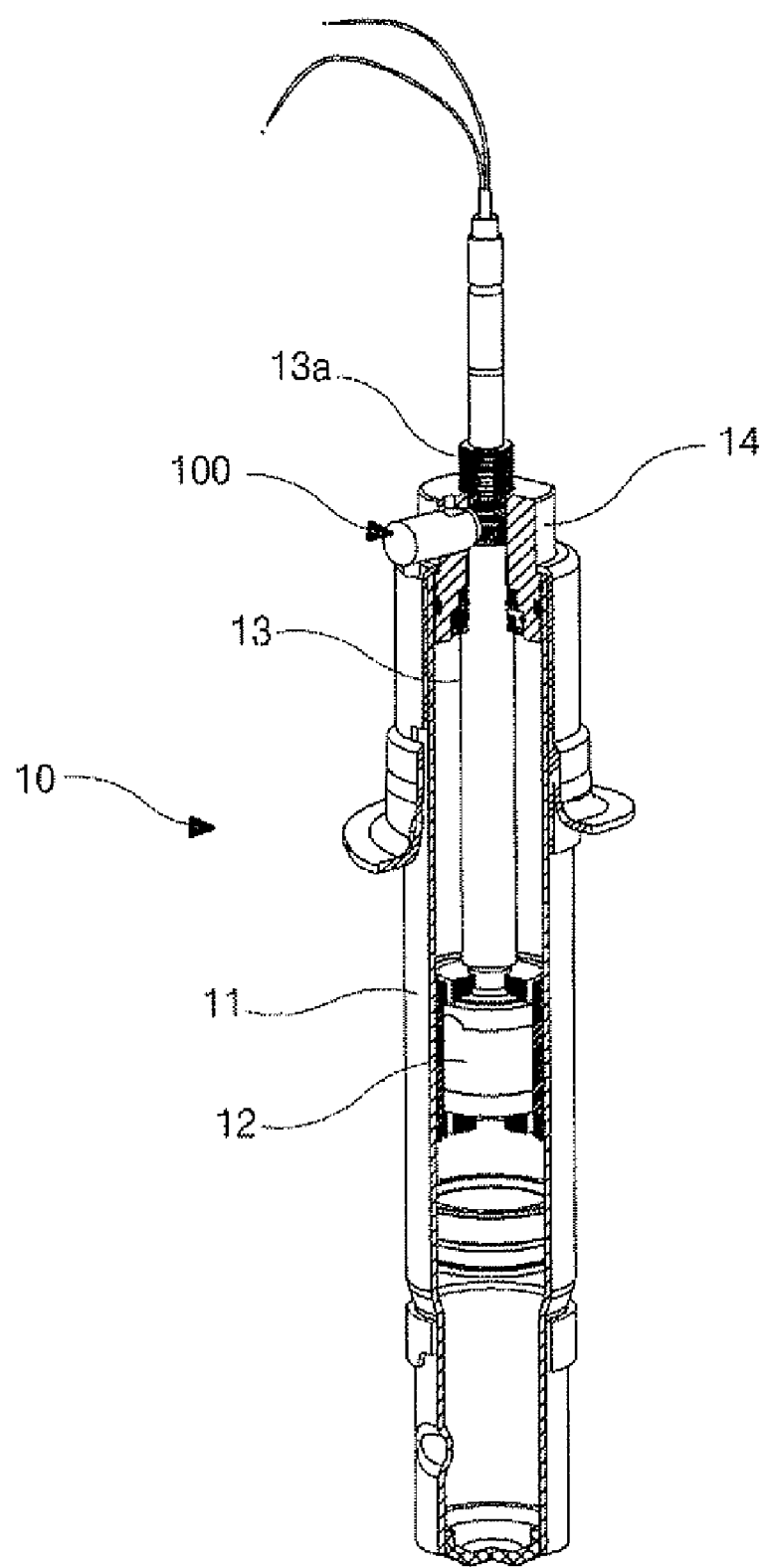
FIG. 8 is a view illustrating that a sensor module of the present invention is installed in a vehicle damper.

FIG. 8 is a partially broken perspective view of the vehicle damper 10 and the sensor module 100 according to an embodiment of the present invention is installed at an upper end portion of the damper 10.

More specifically, the damper 10 includes a cylinder 11, a piston valve 12 installed in the cylinder 11, a piston rod coupled to an upper end of the piston valve 12 and a rod guide 14 for closing an upper end of the cylinder 11 and guiding an up/down movement of the piston rod 13.

The piston valve 12 is formed with a fluid passing hole (not shown) and a compression chamber at a lower portion of the piston valve 12 and an expansion chamber at an upper portion of the piston valve 12 are filled with fluid. Accordingly, the fluid in the compression chamber moves through the fluid passing hole to the expansion chamber at the upper portion in a compression stroke and the fluid in the expansion chamber moves to the compression chamber at the lower portion in an expansion stroke.

It is preferable that the sensor module 100 is installed in the rod guide 14 and, for this end, the rod guide 14 is provided at a side portion thereof with a through hole corresponding to the housing 110 of the sensor module 100.

When coupling the sensor module 100, the GMR sensor 130 should be inserted inside the through hole to approach maximally to the piston rod 13 which moves up and down along the rod guide 14. For accurate detection, it is preferable to install the GMR sensor 130 so close to the piston rod 13 that a distance between the surface of the piston rod 13 and the GMR sensor is approximately 1 mm.

In addition, since the GMR sensor 130 can detect the movement of the object only if a groove pattern is formed on the object, the groove pattern 13a is formed in a direction substantially perpendicular to a moving direction in a portion to be detected of the piston rod 13.

The groove pattern 13a includes a plurality of projections and a plurality of depressions which are formed alternately and the movement of the piston rod 13 can be detected only if the projection and the depression are formed in a regular size and a regular distance even though the they are not exactly perpendicular to the moving direction of the piston rod 13 but slightly inclined.

A control module of the vehicle controls a damping force and a tensile force using the detection result of the sensor module 100 and recently watched is a damper which controls behavior of the fluid passed through the fluid passing hole using a magnetic field as a magneto rheological fluid is filled in the cylinder and a solenoid coil is installed in the piston valve 12.

The magneto rheological fluid is a fluid containing metal particles which can be magnetized and has a property that when a magnetic field is generated at the circumference thereof, its apparent viscosity varies under the influence of the magnetic field. Therefore, the damping force and the tensile force of the damper 10 can be controlled by installing a solenoid coil at a circumference of the fluid passing hole of the piston valve and controlling an intensity of the magnetic field.

Accordingly, the damping force and the tensile force of the damper 10 is electronically controlled by such a manner that when the sensor module 100 according to an embodiment of the present invention detects a movement of the piston rod 13 moving according to an unevenness of or an impact from a road surface, an electronic control unit (ECU) generates a feedback signal and control an intensity of current applied to the solenoid coil using the detection result.

Using the sensor module of the present invention, it is possible to detect in non contact manner and stably a moving direction, a moving distance, a moving speed and the like.

In addition, the sensor module of the present invention can be used regardless of a shape or a kind of an actuator and can detect accurately even if a contact point with an object is limited in a small area.

In addition, it is possible to provide a sensor module having superior durability and rigidity compared with conventional optical or contact sensor.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A sensor module for detecting a relative displacement of an object having a groove pattern with alternately formed projection and depression, comprising:
    a magnet for generating a magnetic field;
    a giant magneto resistance (GMR) sensor installed between the magnet and the object to detect a variation in the magnetic field and output an electric signal, wherein the GMR sensor includes first and second sub sensors, each includes first to fourth resistor devices, and wherein front two resistor devices of the first sub sensor, front two resistor devices of the second sub sensor, rear two resistor devices of the first sub sensor and rear two resistor devices of the second sub sensor are alternately disposed along a moving direction of the object and thus an output signal of the first sub sensor and an output signal of the second sub sensor are generated with a time difference when the object moves;
    a signal processing part for processing the output signal from the GMR sensor to output a square wave; and
    a housing for supporting the magnet, the GMR sensor and the signal processing part.

2. The sensor module for detecting a relative displacement according to claim 1, wherein the GMR sensor has a structure in which a serially connected pair of a first resistor device and a second resistor device and a serially connected pair of a third resistor device and a fourth resistor device are parallelly connected,
    wherein the electric signal is an output voltage generated according to a variation in a magnetic field between a first node between the first resistor device and the second resistor device and a second node between the third resistor device and the fourth resistor device.

3. The sensor module for detecting a relative displacement according to claim 1, wherein the GMR sensor is provided with a first sub sensor and a second sub sensor for detecting a variation in a magnetic field and outputting an electric signal respectively,
    wherein a front end portion of the first sub sensor and a front end portion of the second sub sensor are spaced along a moving direction of the object and thus an output signal of the first sub sensor and an output signal of the second sub sensor are generated with a time difference when the object moves.

4. The sensor module for detecting a relative displacement according to claim 1, wherein the signal processing part comprises:
    a signal amplifying part for amplifying the output signal of the GMR sensor; and
    a digital transformation part for transforming the signal amplified in the signal amplifying part to a square wave to send to an outside of the GMR sensor.

5. The sensor module for detecting a relative displacement according to claim 1, wherein the housing is provided with an opening at an end thereof and the GMR sensor is mounted on an outside of a PCB substrate which closes up the opening.

6. The sensor module for detecting a relative displacement according to claim 5, wherein a protective cover is provided at an outside of the GMR sensor.

7. The sensor module for detecting a relative displacement according to claim 5, wherein the magnet is a permanent magnet which is secured to an inside of the PCB substrate.

8. The sensor module for detecting a relative displacement according to claim 5, wherein a second PCB substrate mounted with the signal processing part and attached circuits is installed inside the housing and the PCB substrate and the second PCB substrate are electrically connected through FPCB.

9. A method of detecting a moving direction of an object using a GMR sensor having a first sensor and a second sensor which are installed to be spaced to each other along a moving direction of the object having a groove pattern with alternately formed projection and depression and output an electrical signal corresponding to a variation in a magnetic field respectively, comprising a step of
    determining a moving direction of the object by recognizing an output sequence of a first electrical signal generated in the first sensor and a second electrical signal generated in the second sensor when the object moves with respect to the first and the second sensors, wherein each of the first and second sub sensors includes first to fourth resistor devices, and wherein front two resistor devices of the first sub sensor, front two resistor devices of the second sub sensor, rear two resistor devices of the first sub sensor and rear two resistor devices of the second sub sensor are alternately disposed along a moving direction of the object and thus an output signal of the first sub sensor and an output signal of the second sub sensor are generated with a time difference when the object moves.

* * * * *